United States Patent
Morikuni

(10) Patent No.: US 12,379,673 B2
(45) Date of Patent: Aug. 5, 2025

(54) CONTROL APPARATUS, LITHOGRAPHY APPARATUS, AND ARTICLE MANUFACTURING METHOD

(71) Applicant: CANON KABUSHIKI KAISHA, Tokyo (JP)

(72) Inventor: Yuichiro Morikuni, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 217 days.

(21) Appl. No.: 18/067,994

(22) Filed: Dec. 19, 2022

(65) Prior Publication Data
US 2023/0119136 A1 Apr. 20, 2023

Related U.S. Application Data

(63) Continuation of application No. PCT/JP2021/027967, filed on Jul. 28, 2021.

(30) Foreign Application Priority Data

Aug. 3, 2020 (JP) ................. 2020-131923

(51) Int. Cl.
G03F 7/00 (2006.01)

(52) U.S. Cl.
CPC .......... *G03F 7/70725* (2013.01); *G03F 7/705* (2013.01); *G03F 7/70758* (2013.01)

(58) Field of Classification Search
CPC ........ G03F 7/20; G03F 7/705; G03F 7/70725; G03F 7/70758; G03F 9/7046; G03F 7/70358; G03F 7/0002; G03F 7/70516; G03F 7/70; G03F 7/70483–70541; G03F 7/706841; G03F 7/70691; G03F 7/70716; G03F 7/70733; G03F 7/7075;
(Continued)

(56) References Cited

U.S. PATENT DOCUMENTS

| 11,460,781 B2 | 10/2022 | Asano et al. |
| 2003/0084808 A1 | 5/2003 | Sugiura |

(Continued)

FOREIGN PATENT DOCUMENTS

| CN | 104238278 A | 12/2014 |
| CN | 111183397 A | 5/2020 |

(Continued)

OTHER PUBLICATIONS

International Search Report issued in International Appln. No. PCT/JP2021/027967 mailed Oct. 19, 2021. English translation provided.

(Continued)

*Primary Examiner* — Christina A Riddle
(74) *Attorney, Agent, or Firm* — ROSSI, KIMMS & McDOWELL LLP

(57) ABSTRACT

A control apparatus for generating a control signal for controlling a control target includes a plurality of neural networks, and a selector configured to select, from the plurality of neural networks, a neural network to be used to generate the control signal, wherein each of the plurality of neural networks is selected by the selector to be used in execution of one corresponding control pattern among a plurality of control patterns for controlling the control target.

15 Claims, 10 Drawing Sheets

(58) Field of Classification Search
CPC ............. G03F 7/70775; G03F 7/70783; G03F 7/70791; G03F 7/70975; G03F 7/70991; G03F 9/7003–7019; G03F 9/7023; G03F 9/7049; G03F 9/7092; G03F 9/7096; G05B 13/02; G05B 13/027; G05B 13/021; G05B 13/0265; G05B 19/4063; G05B 19/4188; G05B 2219/32335; G05B 2219/33034; G05B 2219/45031; G06N 3/02; G06N 3/045; G06N 20/00; G06N 3/08; G06N 3/084; B24B 37/013; B25J 9/16; G05D 1/0016; G05D 1/0022; G05D 1/0033; G05D 1/0038; G09G 5/00; H01L 21/30625; H01L 21/67092; H01L 21/67253; H01L 22/12; H01L 22/20
USPC ...... 355/18, 30, 52–55, 67–77, 133; 700/28, 700/47–48; 706/15–44
See application file for complete search history.

(56) References Cited

U.S. PATENT DOCUMENTS

| | | |
|---|---|---|
| 2005/0128460 A1* | 6/2005 | Van Den Biggelaar ..................... G03F 7/70508 355/75 |
| 2007/0219647 A1* | 9/2007 | Heertjes ............... G05B 19/371 700/44 |
| 2010/0082126 A1 | 4/2010 | Matsushita |
| 2014/0340661 A1* | 11/2014 | Sato .................... G03F 7/70633 430/325 |
| 2016/0170311 A1* | 6/2016 | Schmitt-Weaver .......................... G03F 7/70516 355/67 |
| 2019/0219998 A1 | 7/2019 | Harihara et al. |
| 2019/0286111 A1 | 9/2019 | Yennie et al. |
| 2023/0012400 A1* | 1/2023 | Ito .......................... G03F 7/705 |
| 2023/0176548 A1* | 6/2023 | Kusayanagi ......... G05B 13/027 700/28 |

FOREIGN PATENT DOCUMENTS

| | | |
|---|---|---|
| JP | H07145988 A | 6/1995 |
| JP | 2010086397 A | 4/2010 |
| JP | 2014026300 A | 2/2014 |
| JP | 2019071405 A | 5/2019 |
| JP | 2019102495 A | 6/2019 |
| KR | 1020070093861 A | 9/2007 |
| KR | 1020180061769 A | 6/2018 |
| WO | 2019005547 A1 | 1/2019 |
| WO | 2019146007 A1 | 8/2019 |
| WO | 2019177905 A1 | 9/2019 |

OTHER PUBLICATIONS

Written Opinion issued in International Appln. No. PCT/JP2021/027967 mailed Oct. 19, 2021. English translation provided.
Office Action issued in Chinese Appln. No. 202180058854.3 mailed Apr. 24, 2025.

* cited by examiner

CONTROL APPARATUS, LITHOGRAPHY APPARATUS, AND ARTICLE MANUFACTURING METHOD

CROSS-REFERENCE TO RELATED APPLICATIONS

This application is a Continuation of International Patent Application No. PCT/JP2021/027967, filed Jul. 28, 2021, which claims the benefit of Japanese Patent Application No. 2020-131923, filed Aug. 3, 2020, both of which are hereby incorporated by reference herein in their entirety.

BACKGROUND OF THE INVENTION

Field of the Invention

The present invention relates to a control apparatus, a lithography apparatus, and an article manufacturing method.

Background Art

For a control apparatus that controls a physical amount of a control target, a classic controller such as a PID controller, a controller based on modern control theory, or a controller using a neural network can be used. Alternatively, a controller that uses both a controller including no neural network and a controller including a neural network may be used. In a control apparatus described in Japanese Patent Laid-Open No. 2019-71405, both a PID controller and a controller using a neural network are used to improve control accuracy.

In a conventional control apparatus using a neural network, it takes long time to perform calculation processing, and thus calculation for control may not end within a predetermined time, thereby degrading the real time property of control.

SUMMARY OF THE INVENTION

The present invention provides a technique advantageous in shortening the time taken to perform calculation for control.

One aspect of the present invention is related to a control apparatus for generating a control signal for controlling a control target, and the apparatus comprises: a plurality of neural networks; and a selector configured to select, from the plurality of neural networks, a neural network to be used to generate the control signal, wherein each of the plurality of neural networks is selected by the selector to be used in execution of one corresponding control pattern among a plurality of control patterns for controlling the control target.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain principles of the invention.

DESCRIPTION OF THE EMBODIMENTS

Figure 1:
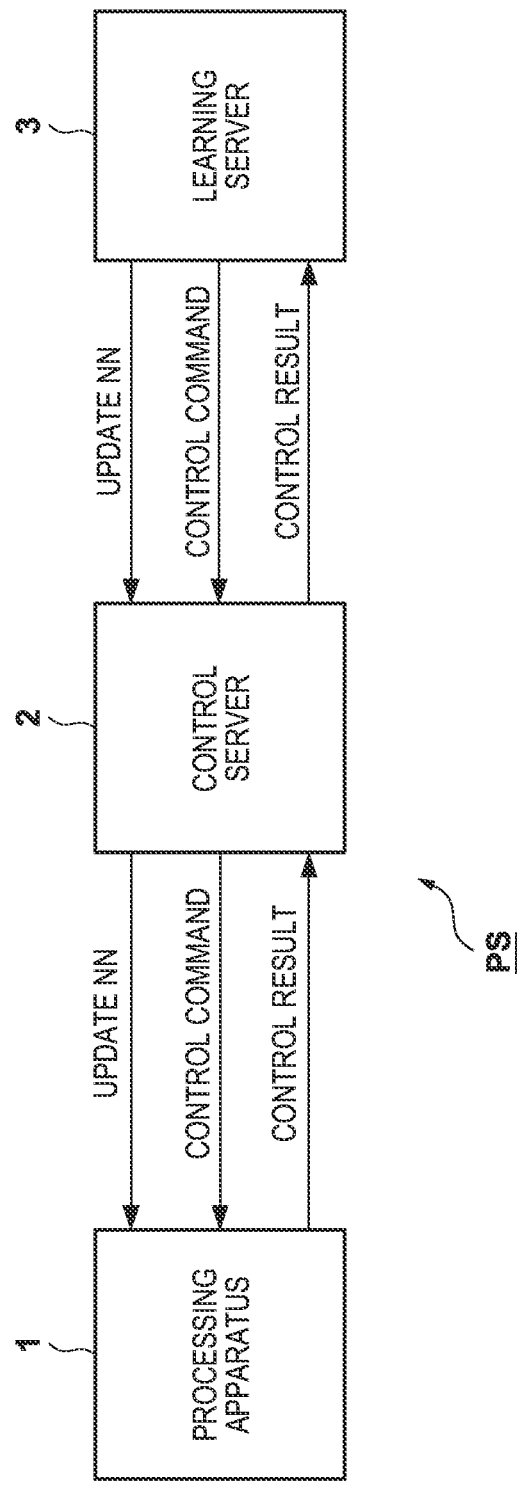
FIG. 1 is a view showing the configuration of a processing system according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

FIG. 1 shows the configuration of a processing system PS according to an embodiment. The processing system PS can include, for example, a processing apparatus 1, a control server (higher level apparatus) 2 that controls the processing apparatus 1, and a learning server (learning apparatus) 3 that executes learning of deciding parameter values of a neural network included in the processing apparatus 1. The processing apparatus 1 is, for example, an apparatus that executes processing for a processing target object, such as a manufacturing apparatus, an inspection apparatus, or a monitoring apparatus. The overview of the processing can include processing, inspection, monitoring, and observation of a processing target object.

The processing apparatus 1 can include a control target and control the control target using a neural network for which parameter values are decided by reinforcement learning. The control server 2 can be configured to send a control command (for example, a driving command) to the processing apparatus 1 and receive a control result (for example, a driving result) from the processing apparatus 1. The control server 2 and the learning server 3 can be formed by, for example, a general-purpose computer installed with a program or a combination of all or some of these components.

The learning server 3 can perform reinforcement learning of deciding a plurality of parameter values of the neural network incorporated in the processing apparatus 1. More specifically, the learning server 3 can send a control command to the processing apparatus 1 and receive a control result from the processing apparatus 1 via the control server 2. Then, the learning server 3 can calculate a reward based on the control result, and update the plurality of parameter values of the neural network based on the reward.

All or some of the functions of the control server 2 may be incorporated in the learning server 3. All or some of the functions of the control server 2 may be incorporated in the processing apparatus 1. The processing apparatus 1, the control server 2, and the learning server 3 may be formed physically integrally or separately. The processing apparatus 1 may be controlled by the control server 2 as a whole, or may include components controlled by the control server 2 and those not controlled by the control server 2. If a calculation cost concerning update of the parameter values of the neural network is high, it may be advantageous to separate the control server 2 and the learning server 3. If there exist a plurality of control targets, one control server 2 and a plurality of learning servers 3 may be provided.

Figure 2:
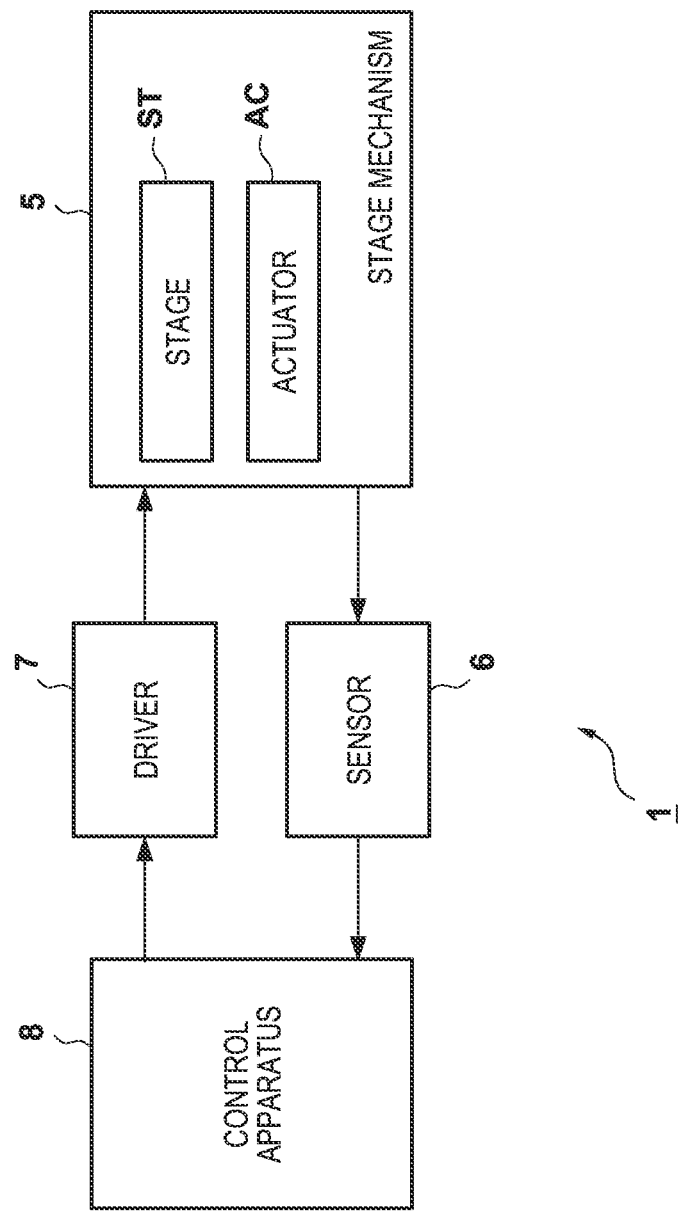
FIG. 2 is a block diagram showing an arrangement example of a processing apparatus.

FIG. 2 exemplifies the arrangement of the processing apparatus 1. The processing apparatus 1 can include a stage mechanism 5 including a stage (holder) ST as a control target, a sensor 6 that detects the position or state of the stage ST, a driver 7 that drives the stage mechanism 5, and a control apparatus 8 that gives a command value to the driver 7 and receives an output from the sensor 6. The stage ST can hold a positioning target object. The stage ST can be guided by a guide (not shown). The stage mechanism 5 can include an actuator AC that moves the stage ST. The driver 7 drives the actuator AC. More specifically, for example, the driver 7 can supply, to the actuator AC, a current (electric energy) corresponding to the command value given from the control apparatus 8. The actuator AC can move the stage ST by a force (mechanical energy) corresponding to the current supplied from the driver 7. The control apparatus 8 can control the position or state of the stage ST as the control target using the neural network for which the parameter values are decided by reinforcement learning.

Figure 3:
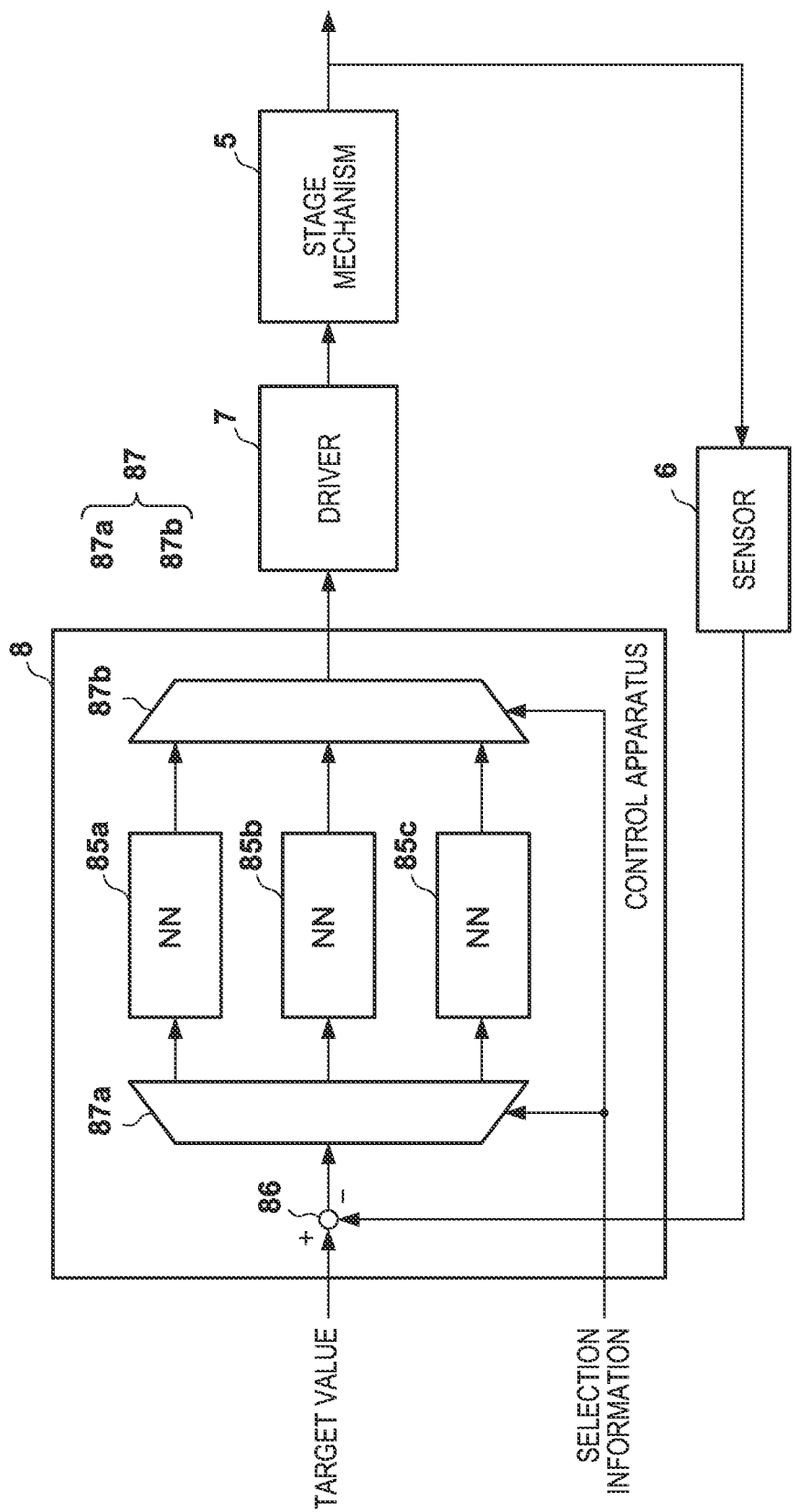
FIG. 3 is a block diagram showing one arrangement example of the processing apparatus.

FIG. 3 is a block diagram showing one arrangement example of the processing apparatus 1 exemplified in FIG. 2. The processing apparatus 1 can include the stage mechanism 5, the sensor 6 that detects the position or state of the stage ST, the driver 7 that drives the stage mechanism 5, and the control apparatus 8 that gives a manipulated variable (control signal) to the driver 7 based on a control deviation and receives an output from the sensor 6. The control apparatus 8 is formed by, for example, a PLD (an abbreviation of Programmable Logic Device) such as an FPGA (an abbreviation of Field Programmable Gate Array), an ASIC (an abbreviation of Application Specific Integrated Circuit), a general-purpose computer installed with a program, or a combination of all or some of these components.

The control apparatus 8 generates a control signal for controlling the stage mechanism 5 (stage ST) as a control target. The control apparatus 8 can include a plurality of neural networks 85a, 85b, and 85c, and a selector 87 that selects, from the plurality of neural networks 85a, 85b, and 85c, a neural network to be used to generate the control signal. Based on selection information, the selector 87 can select, from the plurality of neural networks 85a, 85b, and 85c, the neural network to be used to generate the control signal. The selected neural network can function as a compensator to generate a manipulated variable based on the input information (control deviation). The selection information may be generated in the control apparatus 8 or provided from another apparatus (for example, the higher level apparatus). The selection information can be generated so that the neural network to be used is selected from the plurality of neural networks 85a, 85b, and 85c in accordance with a control pattern selected from a plurality of control patterns. The plurality of control patterns can be control patterns that can be distinguished from each other. The control pattern can include, for example, a target value string (time-series data of target values).

The control apparatus 8 can include a subtractor 86 that calculates a difference (that is, a control deviation) between the target value (for example, a target position) and a state signal indicating the state (for example, the position) of the stage mechanism 5 (the stage ST). The selector 87 can include a demultiplexer 87a and a multiplexer 87b. The demultiplexer 87a can supply the control deviation to the neural network designated by the selection information among the plurality of neural networks 85a, 85b, and 85c. The multiplexer 87b can output a signal generated by the neural network designated by the selection information among the plurality of neural networks 85a, 85b, and 85c. Note that FIG. 3 exemplifies the three neural networks 85a, 85b, and 85c but the number of neural networks is arbitrary. The number of layers and the number of neurons of each of the plurality of neural networks 85a, 85b, and 85c are arbitrary. The parameter values of the plurality of neural networks 85a, 85b, and 85c can be decided by reinforcement learning.

Each of the plurality of neural networks 85a, 85b, and 85c can be selected by the selector 87 to be used in execution of one corresponding control pattern among the control patterns for controlling the control target. Alternatively, each of the plurality of neural networks 85a, 85b, and 85c can be selected by the selector 87 to be used in execution of at least part of at least one of the plurality of control patterns for controlling the control target.

Figure 4:
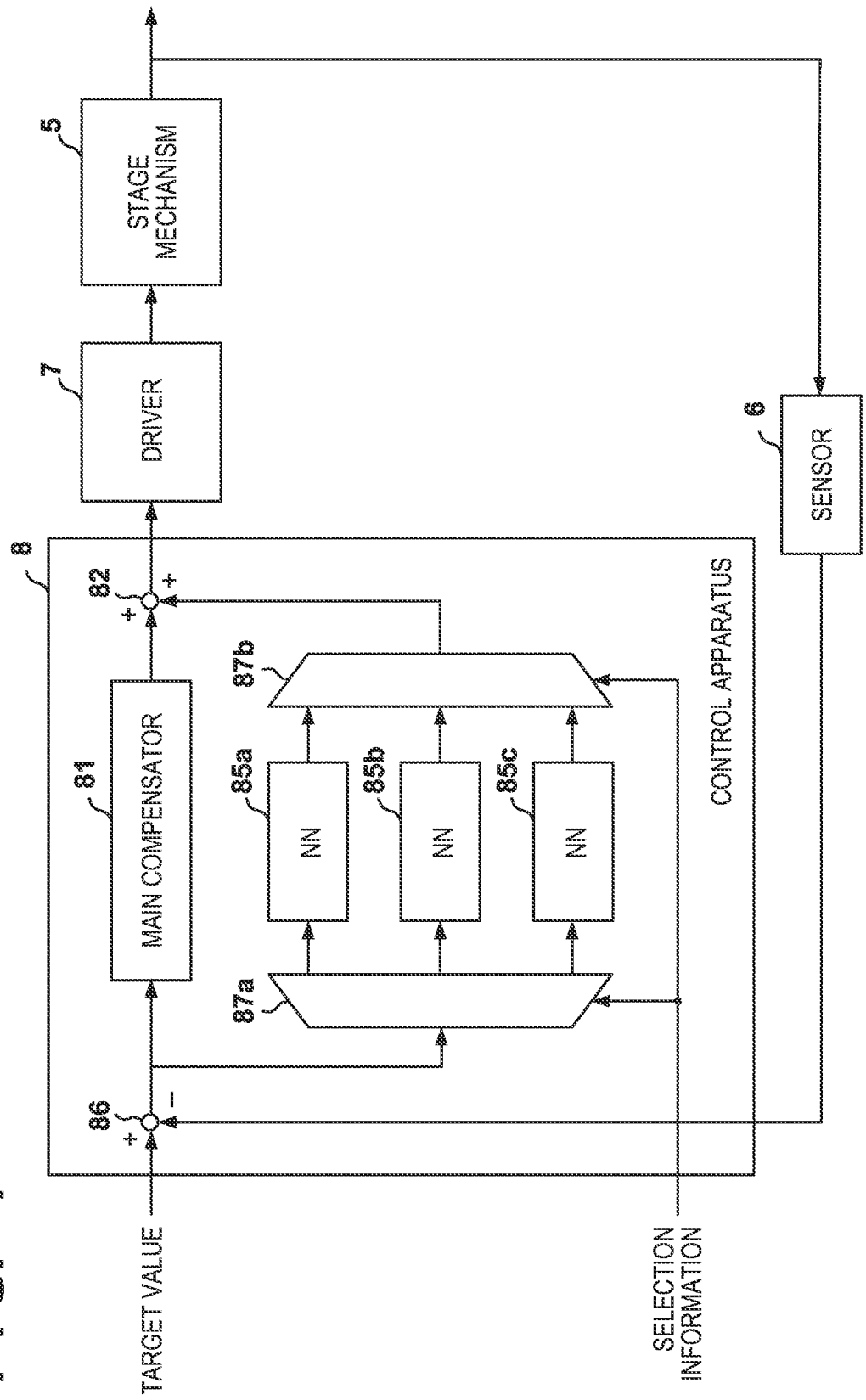
FIG. 4 is a block diagram showing another arrangement example of the processing apparatus.

FIG. 4 is a block diagram showing another arrangement example of the processing apparatus 1 exemplified in FIG. 2. The arrangement example shown in FIG. 4 includes an arrangement obtained by adding a main compensator 81 and an adder 82 to the arrangement example shown in FIG. 3. The main compensator 81 can be, for example, a compensator (for example, a PID compensator) including a P element (proportional element), an I element (integral element), and a D element (derivative element) but is not limited to this. The subtractor 86 calculates a difference between the target value (for example, the target position) and the state signal indicating the state (for example, the position) of the stage mechanism 5 (the stage ST), and supplies the difference to the neural network selected by the selector 87 while supplying the difference to the main compensator 81. The adder 82 can add the first manipulated variable generated by the main compensator 81 and the second manipulated variable generated by the neural network selected by the selector 87, thereby generating a control signal. This control signal can be supplied to the driver 7.

Figure 5:
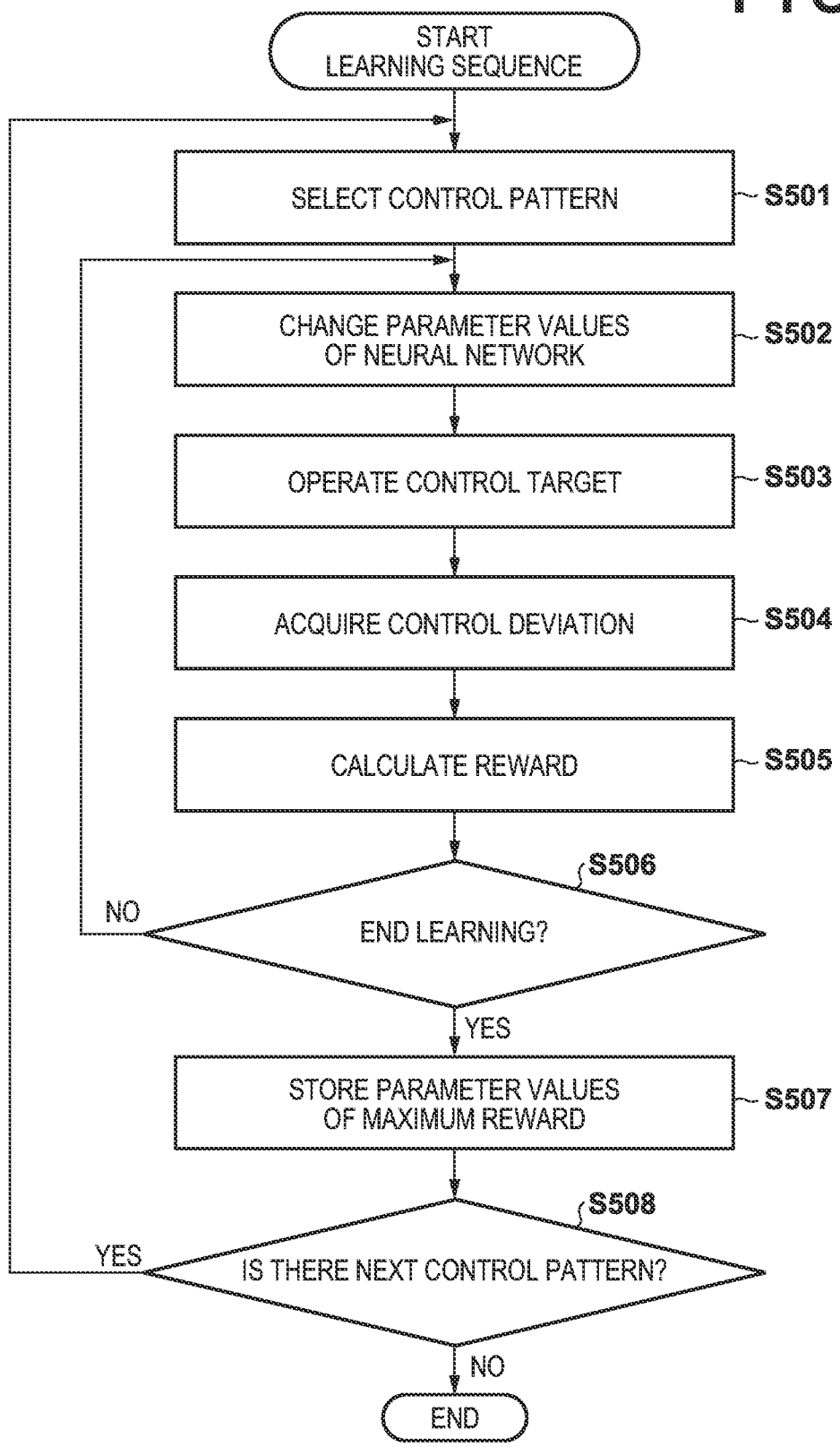
FIG. 5 is a flowchart exemplifying a learning sequence in the processing system.

FIG. 5 exemplifies a learning sequence in the processing system PS. This learning sequence is controlled by the learning server 3. In step S501, the learning server 3 selects one of the plurality of control patterns used for learning of the plurality of neural networks 85a, 85b, and 85c. Steps S502 to S505 indicate a loop to be executed repeatedly. In step S502 executed first in this loop, the learning server 3 initializes the parameter values of the neural network for which learning is to be executed. In step S502 executed for the second time or thereafter in this loop, the learning server 3 changes the parameter values of the neural network. The parameter values of the neural network can be initialized and changed when the learning server 3 sends the parameter values to the processing apparatus 1 via the control server 2.

In step S503, the learning server 3 sends the control pattern and a control command to the processing apparatus 1 via the control server 2, thereby operating the processing apparatus 1. More specifically, the learning server 3 can send control information including the control pattern to the control server 2, and the control server 2 can send a control command including the control pattern to the processing apparatus 1. The processing apparatus 1 can operate the stage mechanism 5 including the stage (holder) ST as a control target in accordance with the control pattern. The processing apparatus 1 can monitor this operation, and save a control result. The control result is data generated in the operation of the stage mechanism 5, and can include, for example, data indicating a control deviation calculated by the subtractor 86. The control result can be sent from the processing apparatus 1 to the learning server 3 via the control server 2.

In step S505, the learning server 3 can calculate a reward based on the control result sent from the processing apparatus 1 in accordance with a predetermined formula. The formula can be set so that, for example, as the control deviation during an evaluation period is smaller, the value of the reward is larger. In step S505, the learning server 3 determines whether to end learning. If the learning server 3 ends learning, the process advances to step S507; otherwise, the process returns to step S503. Whether to end learning can be determined in accordance with, for example, whether the number of times of learning (the number of times steps S502 to S505 are executed) has reached a predetermined value. In this case, if the number of times of learning has reached the predetermined number, the learning server 3 ends learning; otherwise, the learning server 3 can continue learning. If the process returns to step S503, the parameter values of the neural network can be changed, in step S503, in accordance with a predetermined algorithm so as to increase the reward.

In step S507, the learning server 3 decides, as learned parameter values, the parameter values with which the maximum reward is obtained among the rewards calculated by repeating steps S502 to S505, and saves them as the parameter values of the neural network for which learning is to be executed. For example, this means that if the neural network for which learning is to be executed is the neural network 85a, the parameter values of the neural network 85a are set.

In step S508, the learning server 3 determines whether there is the next control pattern (there is the neural network for which learning is to be executed next). If there is the next control pattern, the process returns to step S501. In this case, steps S501 to S507 are executed for the next control pattern.

The time taken to perform calculation in the control apparatus using the neural network depends on the scale (the number of layers and the number of neurons) of the neural network. The control apparatus 8 needs to provide a command value (for example, a current command value) to the driver 7 at a predetermined time interval. If the scale of the neural network is large, calculation of the command value may not end within a predetermined time. To cope with this, in this embodiment, each of the plurality of neural networks 85a, 85b, and 85c is formed by a small neural network, and the neural network to be used is selected from the plurality of neural networks 85a, 85b, and 85c based on the selection information. If the control apparatus 8 includes only a single neural network, the single neural network needs to handle all the control patterns. Therefore, the scale of the neural network is large, and it takes long time to execute learning. On the other hand, if the neural network corresponding to the control pattern is selected from the plurality of neural networks 85a, 85b, and 85c and used, the scale of each neural network can be made small. This can shorten the calculation time by each neural network, and also shorten the time taken to execute learning.

Figure 6:
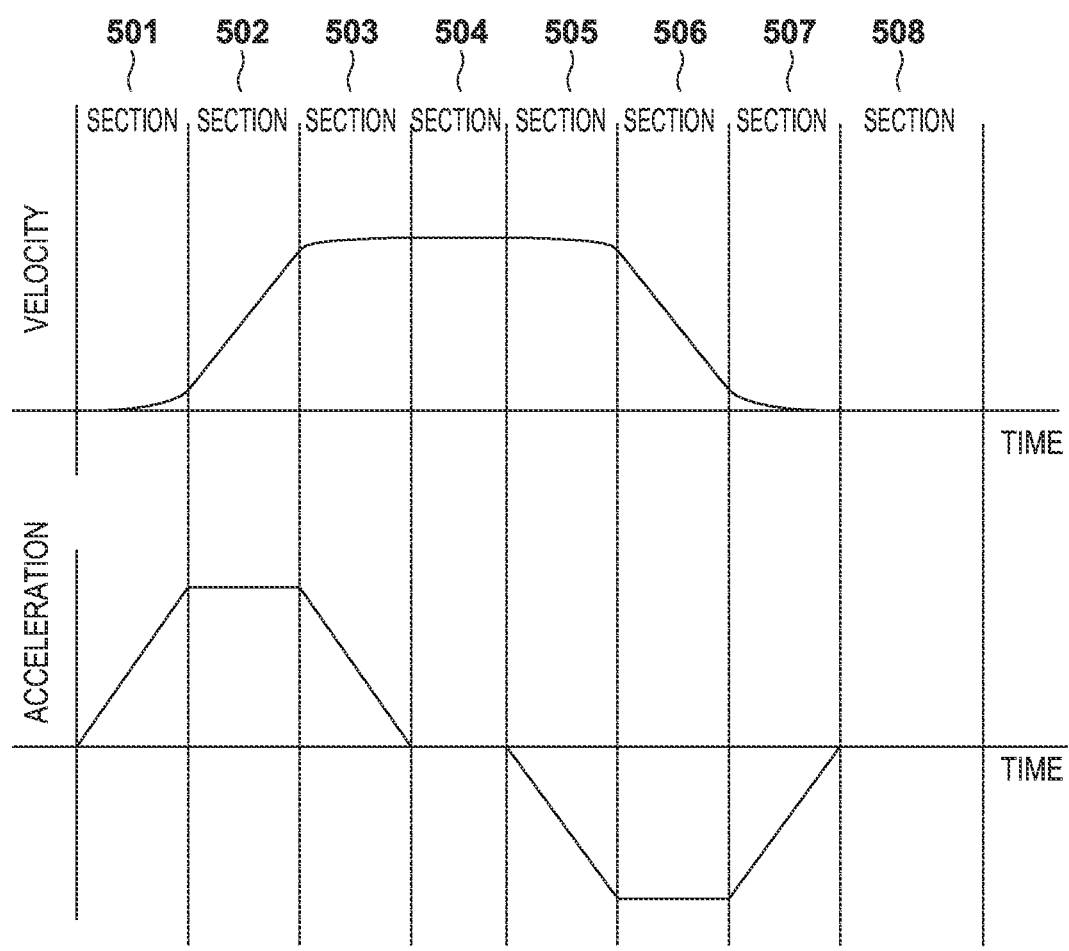
FIG. 6 is a timing chart exemplifying a velocity profile and an acceleration profile of a stage.

FIG. 6 exemplifies a velocity profile and an acceleration profile of the stage ST. The velocity profile is obtained by differentiating a position profile (time-series data of the target positions), and the acceleration profile is obtained by differentiating the position profile two times. The position profile, the velocity profile, and the acceleration profile can be understood as a driving profile or a control profile.

In the example shown in FIG. 5, the driving profile includes a plurality of time sections, more specifically, sections 501 to 508. The section 501 is a jerk section during which the acceleration of the control target increases within the positive range until the control target reaches a uniform acceleration. The section 502 is a uniform acceleration section during which the acceleration of the control target is maintained at a positive constant value (uniform acceleration). The section 503 is a jerk section during which the acceleration of the control target decreases within the positive range until the control target reaches the uniform velocity. The section 504 is a uniform velocity section during which the control target moves at the uniform velocity, that is, the acceleration of the control target is maintained at zero. The section 505 is a jerk section during which the absolute value of the acceleration of the control target increases within the negative range until the control target reaches a negative uniform acceleration. The section 506 is a uniform acceleration section during which the acceleration of the control target is maintained at a negative constant value (uniform acceleration). The section 507 is a jerk section during which the absolute value of the acceleration of the control target decreases within the negative range until the control target stops. The section 508 is a stationary section during which the control target stops. The selector 87 can select the neural network to be used for control from the plurality of neural networks 85a, 85b, and 85c in accordance with the current time section among the plurality of time sections. For example, information indicating the current time section is given as the selection information to the selector 87.

In one example, the first control pattern can be defined from the start of the section 501 to the end of the section 502, the second control pattern can be defined from the start of the section 503 to the end of the section 505, and the third control pattern can be defined from the start of the section 506 to the end of the section 508. In this example, the neural networks 85a, 85b, and 85c can be assigned to the first control pattern, the second control pattern, and the third control pattern, respectively. In another example, a control pattern may be defined by adding an offset to a period including at least one of the plurality of time sections classified in accordance with the acceleration, as described above. For example, the first control pattern can be defined from the start of the section 501 to the end of the section 502, that is, until 10 msec later, and the second control pattern can be defined from the end of the section 502, that is, from 10 msec later, to the end of the section 508.

If a period during which a plurality of control patterns overlap each other is not included, the learning server 3 may simultaneously execute learning of the plurality of neural networks respectively corresponding to the plurality of control patterns.

Figure 7:
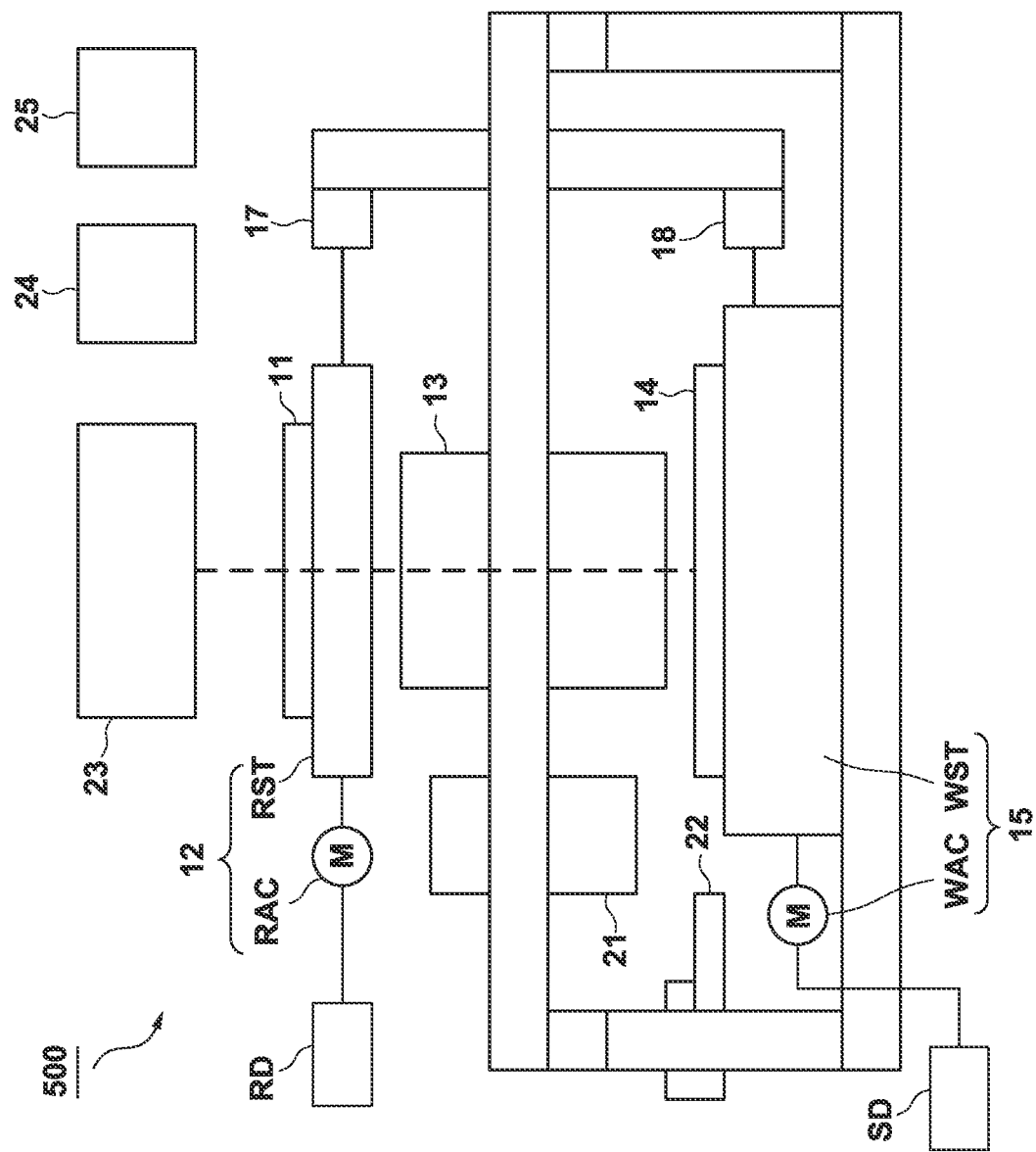
FIG. 7 is a view showing an example in which the processing system is applied to a scanning exposure apparatus (lithography apparatus).

An example in which the above-described processing system PS is applied to a scanning exposure apparatus 500 will be described below with reference to FIG. 7. The scanning exposure apparatus 500 is a step-and-scan exposure apparatus that performs scanning exposure of a substrate 14 by slit light shaped by a slit member. The scanning exposure apparatus 500 can include an illumination optical system 23, an original stage mechanism 12, a projection optical system 13, a substrate stage mechanism 15, a first position measurement unit 17, a second position measurement unit 18, a substrate mark measurement unit 21, a substrate conveyance unit 22, a temperature controller 25, drivers RD and SD, and a control unit 24.

The control unit 24 can control the illumination optical system 23, the original stage mechanism 12, the projection optical system 13, the substrate stage mechanism 15, the first position measurement unit 17, the second position measurement unit 18, the substrate mark measurement unit 21, the substrate conveyance unit 22, and the temperature controller 25. The control unit 24 controls processing of transferring a pattern of an original 11 to the substrate 14. The illumination optical system 23, the original stage mechanism 12, the projection optical system 13, the substrate stage mechanism 15, the substrate conveyance unit 22, and/or the temperature controller 25 is an operation unit that operates to perform the processing of transferring the pattern of the original 11 to the substrate 14. The control unit 24 is formed by, for example, a PLD (an abbreviation of Programmable Logic Device) such as an FPGA (an abbreviation of Field Programmable Gate Array), an ASIC (an abbreviation of Application Specific Integrated Circuit), a general-purpose computer installed with a program, or a combination of all or some of these components. The control unit 24 can correspond to the control apparatus 8 in the processing apparatus 1 shown in FIG. 2 or 3. The drivers RD and SD can correspond to the driver 7 in the processing apparatus 1 shown in FIG. 2 or 3.

The original stage mechanism 12 and the substrate stage mechanism 15 can form a scanning mechanism that scans the original 11 and the substrate 14 so as to transfer the pattern of the original 11 to the substrate 14. The original stage mechanism 12 can include an original stage RST that holds the original 11, and a first actuator RAC that drives the original stage RST. The first actuator RAC is driven by the first driver RD. The substrate stage mechanism 15 can include a substrate stage WST that holds the substrate 14, and a second actuator WAC that drives the substrate stage WST. The second actuator WAC is driven by the second driver SD. The illumination optical system 23 illuminates the original 11. The illumination optical system 23 shapes, by a light shielding member such as a masking blade, light emitted from a light source (not shown) into, for example, band-like or arcuate slit light long in the X direction, and illuminates a portion of the original 11 with this slit light. The original 11 and the substrate 14 are held by the original stage RST and the substrate stage WST, respectively, and arranged at almost optically conjugate positions (on the object plane and image plane of the projection optical system 13) via the projection optical system 13.

The projection optical system 13 has a predetermined projection magnification (for example, 1, ½, or ¼), and projects the pattern of the original 11 on the substrate 14 by the slit light. A region (a region irradiated with the slit light) on the substrate 14 where the pattern of the original 11 is projected can be called an irradiation region. The original stage RST and the substrate stage WST are configured to be movable in a direction (Y direction) orthogonal to the optical axis direction (Z direction) of the projection optical system 13. The original stage RST and the substrate stage WST are relatively scanned at a velocity ratio corresponding to the projection magnification of the projection optical system 13 in synchronism with each other. This scans the substrate 14 in the Y direction with respect to the irradiation region, thereby transferring the pattern formed on the original 11 to a shot region of the substrate 14. Then, by sequentially performing such scanning exposure for the plurality of shot regions of the substrate 14 while moving the substrate stage WST, the exposure processing for the one substrate 14 is completed.

The first position measurement unit 17 includes, for example, a laser interferometer, and measures the position of the original stage RST. For example, the laser interferometer irradiates, with a laser beam, a reflecting plate (not shown) provided in the original stage RST, and detects a displacement (a displacement from a reference position) of the original stage RST by interference between the laser beam reflected by the reflecting plate and the laser beam reflected by a reference surface. The first position measurement unit 17 can acquire the current position of the original stage RST based on the displacement. In this example, the first position measurement unit 17 may measure the position of the original stage RST by a position measurement device, for example, an encoder instead of the laser interferometer.

The second position measurement unit 18 includes, for example, a laser interferometer, and measures the position of the substrate stage WST. For example, the laser interferometer irradiates, with a laser beam, a reflecting plate (not shown) provided in the substrate stage WST, and detects a displacement (a displacement from a reference position) of the substrate stage WST by interference between the laser beam reflected by the reflecting plate and the laser beam reflected by a reference surface. The second position measurement unit 18 can acquire the current position of the substrate stage WST based on the displacement. In this example, the second position measurement unit 18 may measure the position of the substrate stage WST by a position measurement device, for example, an encoder instead of the laser interferometer.

The substrate mark measurement unit 21 includes, for example, an optical system and an image sensor, and can detect the position of a mark provided on the substrate 14. The substrate conveyance unit 22 supplies the substrate 14 to the substrate stage WST and collects the substrate 14 from the substrate stage WST. The temperature controller 25 keeps the temperature and humidity in the chamber (not shown) of the scanning exposure apparatus 500 constant.

Figure 8:
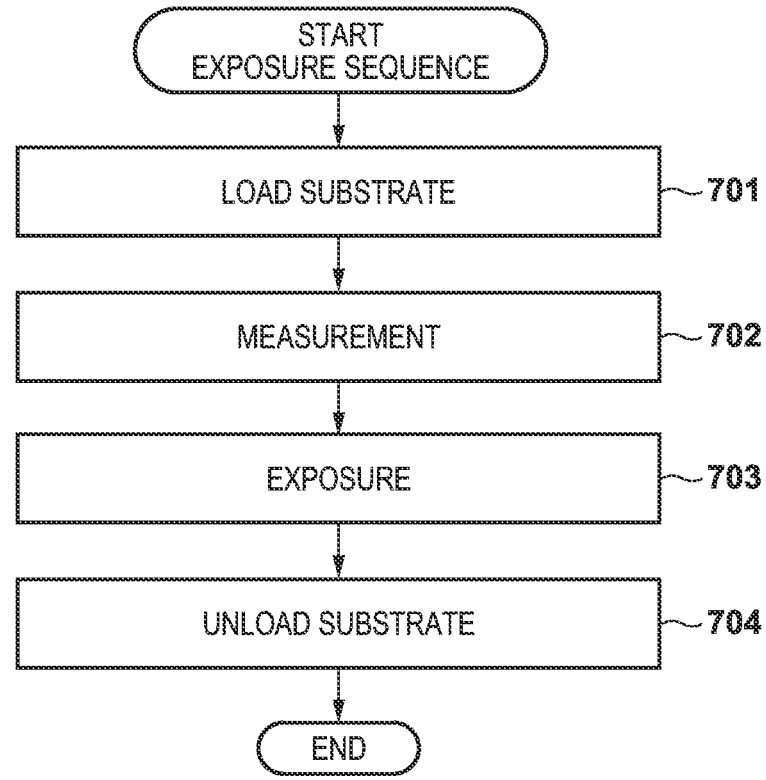
FIG. 8 is a flowchart exemplifying the exposure sequence of the scanning exposure apparatus.

FIG. 8 exemplifies the exposure sequence of the scanning exposure apparatus 500. In step S701 (substrate load sequence), the control unit 24 controls the substrate conveyance unit 22 to load (convey) the substrate 14 onto the substrate stage WST. More specifically, in step S702 (measurement sequence), the control unit 24 executes measurement for alignment of the substrate 14 and the original 11. More specifically, in step S702, the control unit 24 can control the substrate stage mechanism 15 so that the mark of the substrate 14 falls within the field of view of the substrate mark measurement unit 21, and control the substrate mark measurement unit 21 to detect the position of the mark of the substrate 14. This operation can be executed for each of the plurality of marks of the substrate 14. In step S703 (exposure sequence), the control unit 24 controls the substrate stage mechanism 15, the original stage mechanism 12, the illumination optical system 23, and the like so that the pattern of the original 11 is transferred to each of the plurality of shot regions of the substrate 14. In step S704 (substrate unload sequence), the control unit 24 controls the substrate conveyance unit 22 to unload (convey) the substrate 14 on the substrate stage WST.

An example in which the processing system PS is applied to control of the substrate stage mechanism 15 in the scanning exposure apparatus 500 will now be described. The control apparatus 8, the driver 7, the sensor 6, and the actuator AC in FIG. 2 correspond to the control unit 24, the driver SD, the second position measurement unit 18, and the second actuator WAC, respectively. Similar to the control apparatus 8 exemplified in FIG. 3 or 4, the control unit 24 can include the plurality of neural networks 85a, 85b, and 85c. The control unit 24 can control the substrate stage WST of the substrate stage mechanism 15 using the neural network selected from the plurality of neural networks 85a, 85b, and 85c in accordance with the control pattern.

Each of the plurality of control patterns used to select, from the plurality of neural networks 85a, 85b, and 85c, the neural network to be used for control can be defined based on the plurality of time sections, as exemplarily described with reference to FIG. 6. As described above, each of the plurality of neural networks 85a, 85b, and 85c can be selected in execution of the control pattern defined based on the plurality of time sections.

The plurality of control patterns may include a control pattern for step S701, that for step S702, that for step S703, and that for step S704. The control pattern for step S701 can be called a load control pattern. The control pattern for step S702 can be called a measurement control pattern. The control pattern for step S703 can be called an exposure control pattern. The control pattern for step S704 can be called an unload control pattern. For example, it is possible to control step S701 by the neural network 85a, control step S702 by the neural network 85b, and control step S703 by the neural network 85c.

Alternatively, control in the entire period of one sequence or part of it may be set as one control pattern, and assigned with one neural network. For example, the neural network 85a can be applied to the sections 506 to 508 in the measurement sequence. The neural network 85b can be applied to the sections 502 and 504 in the exposure sequence.

In the measurement sequence, it is necessary to reduce a control deviation immediately after the stop of the substrate stage WST. This is done to measure the position of the mark of the substrate 14 by the substrate mark measurement unit 21 during the section 508 (stop section) in FIG. 5. As a section during which one neural network is used in the measurement sequence, a section from the start of the section 506 during deceleration to the end of the section 508 can be assigned. A vibration component excited in the section 505 is smaller than a vibration component excited in the section 506. The start of the section during which one neural network is used in the measurement sequence is effectively set to the start of the section 506.

On the other hand, in the exposure sequence, it is necessary to reduce a deviation while the velocity of the substrate stage WST is uniform. This is done to expose the substrate 14 in the section (uniform velocity section) 504, in FIG. 5, during which the uniform velocity is maintained. As a section during which one neural network is used in the exposure sequence, a section from the start of the section 502 during acceleration to the end of the section 504 can be assigned. A vibration component excited in the section 501 is smaller than a vibration component excited in the section 502. Therefore, the start of the section during which one neural network is used in the exposure sequence is effectively set to the start of the section 502.

As described above, by providing the plurality of small neural networks respectively corresponding to the plurality of sections during which the control deviation of the substrate stage WST is desirably reduced, and using the neural networks while switching them, the effect of shortening the learning time and the calculation time is obtained.

An example in which the processing system PS is applied to control of the original stage mechanism 12 in the scanning exposure apparatus 500 will be described next. The control apparatus 8, the driver 7, the sensor 6, and the actuator AC in FIG. 2 correspond to the control unit 24, the driver RD, the first position measurement unit 17, and the actuator RAC, respectively. Similar to the control apparatus 8 exemplified in FIG. 3 or 4, the control unit 24 can include the plurality of neural networks 85a, 85b, and 85c. The control unit 24 can control the original stage RST of the original stage mechanism 12 using the neural network selected from the plurality of neural networks 85a, 85b, and 85c in accordance with the control pattern.

Each of the plurality of control patterns used to select, from the plurality of neural networks 85a, 85b, and 85c, the neural network to be used can be defined based on the plurality of time sections, as exemplarily described with reference to FIG. 6. Alternatively, the plurality of control patterns may include a control pattern for a step of loading the original 11, that for a step of unloading the original 11, and that for step S703. Alternatively, control in the entire period of one sequence or part of it may be set as one control pattern, and assigned with one neural network.

An example in which the processing system PS is applied to control of the substrate conveyance unit 22 in the scanning exposure apparatus 500 will be described next. The control apparatus 8, the driver 7, the sensor 6, and the stage mechanism 5 in FIG. 2 correspond to the control unit 24, drivers (not shown), and the substrate conveyance unit 22, respectively. Similar to the control apparatus 8 exemplified in FIG. 3 or 4, the control unit 24 can include the plurality of neural networks 85a, 85b, and 85c. The control unit 24 can control the substrate conveyance unit 22 using the neural network selected from the plurality of neural networks 85a, 85b, and 85c in accordance with the control pattern.

By applying the control apparatus 8 to control of the substrate conveyance unit 22, it is possible to suppress a control deviation during driving of the substrate conveyance unit 22, thereby improving the reproducibility of the position of the substrate 14 supplied to the substrate stage WST. It is also possible to improve the throughput by suppressing the control deviation while increasing the acceleration and velocity.

Control based on the plurality of time sections exemplarily described with reference to FIG. 6 may be applied to control of the substrate conveyance unit 22. That is, each of the plurality of control patterns used to select, from the plurality of neural networks 85a, 85b, and 85c, the neural network to be used for control can be defined based on the plurality of time sections. In other words, each of the plurality of neural networks 85a, 85b, and 85c can be selected in execution of the control pattern defined based on the plurality of time sections.

Similar to the substrate stage mechanism 15, with respect to the substrate conveyance unit 22 as well, by providing the plurality of small neural networks respectively corresponding to the plurality of sections during which the control deviation is desirably reduced, and using the neural networks while switching them, the effect of shortening the learning time and the calculation time is obtained.

Figure 9:
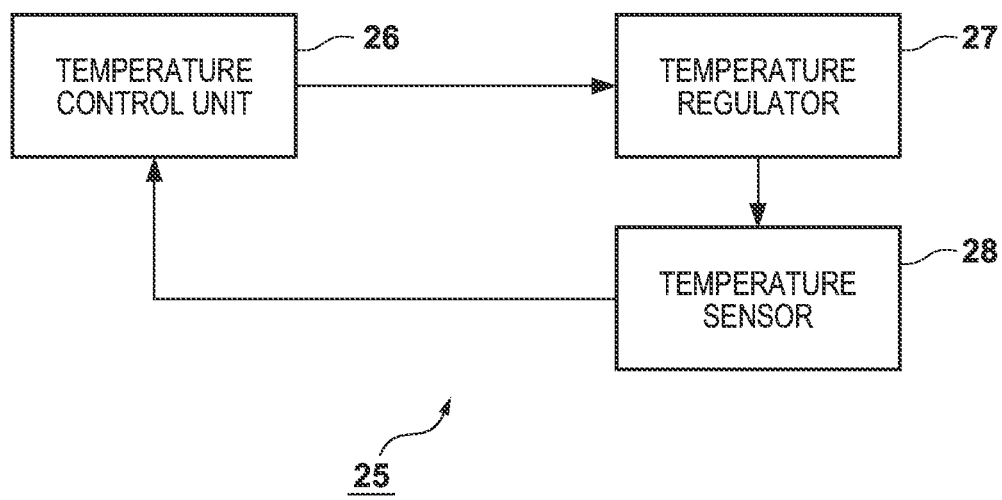
FIG. 9 is a block diagram showing an arrangement example of a temperature controller.

An example in which the processing system PS shown in FIG. 1 is applied to the temperature controller 25 in the scanning exposure apparatus 500 will be described next. FIG. 9 shows an arrangement example of the temperature controller 25. The temperature controller 25 can include a temperature control unit (control apparatus) 26, a temperature regulator 27 that regulates the temperature of the control target, and a temperature sensor 28 that measures the temperature of the control target. The temperature control unit 26 sends a command value to the temperature regulator 27 at a predetermined time interval. The temperature regulator 27 regulates the temperature in the chamber of the scanning exposure apparatus 500 by a heater and/or cooler (not shown). The temperature in the chamber of the scanning exposure apparatus 500 is measured by the temperature sensor 28, and the measurement result is sent to the temperature control unit 26.

Figure 10:
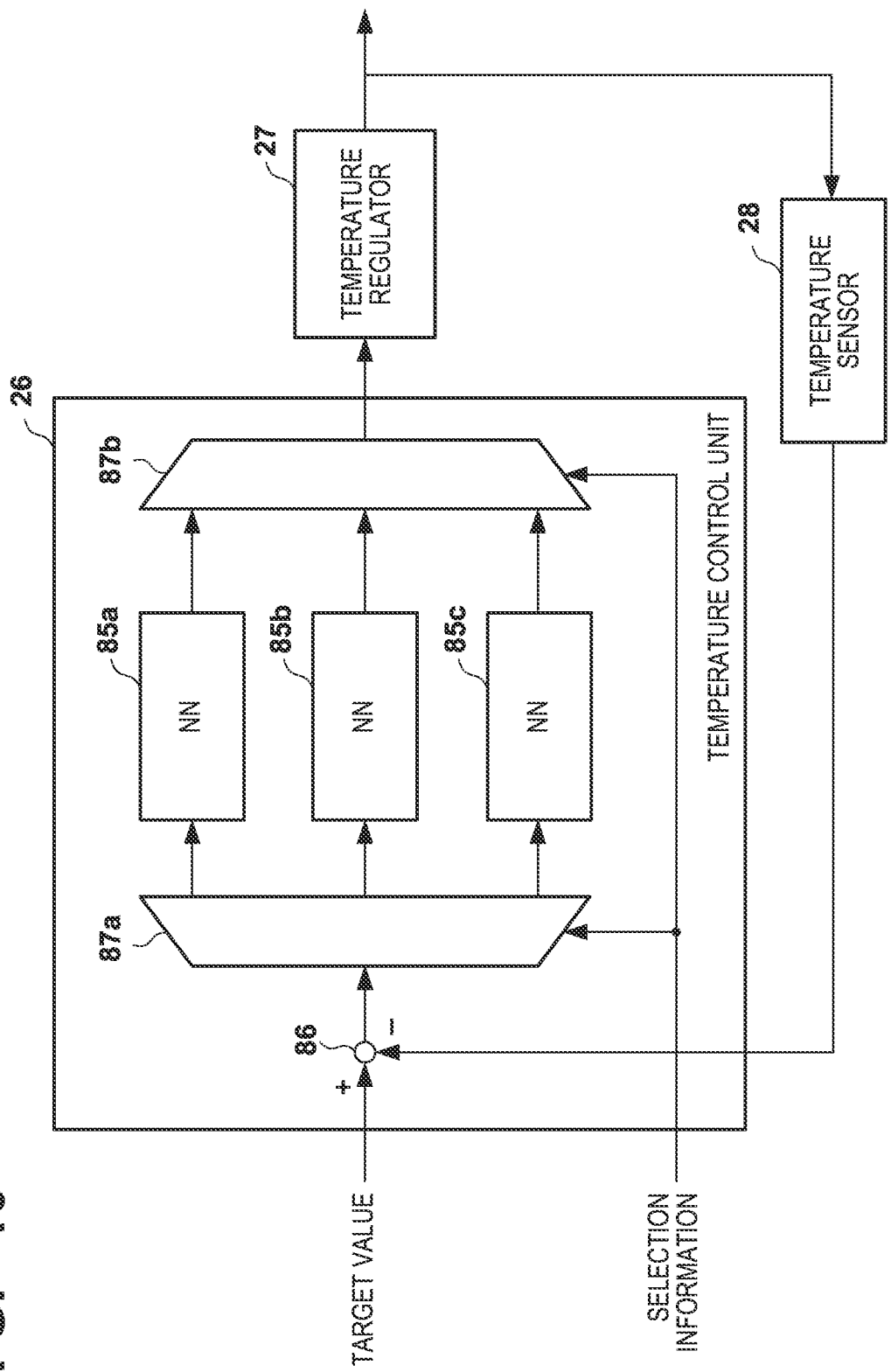
FIG. 10 is a block diagram showing one arrangement example of the temperature controller.

FIG. 10 is a block diagram showing one arrangement example of the temperature controller 25 exemplified in FIG. 9. The temperature controller 25 can include the temperature regulator 27 that regulates the temperature in the chamber as the control target, the temperature sensor 28 that measures the temperature at a predetermined position in the chamber, and the temperature control unit 26 that gives a manipulated variable to the temperature regulator 27 based on a control deviation and receives an output from the temperature sensor 28. The temperature control unit 26 is formed by, for example, a PLD (an abbreviation of Programmable Logic Device) such as an FPGA (an abbreviation of Field Programmable Gate Array), an ASIC (an abbreviation of Application Specific Integrated Circuit), a general-purpose computer installed with a program, or a combination of all or some of these components.

The temperature control unit 26 generates a control signal for controlling the temperature regulator 27. The temperature control unit 26 can include the plurality of neural networks 85a, 85b, and 85c, and the selector 87 that selects, from the plurality of neural networks 85a, 85b, and 85c, the neural network to be used to generate a control signal. Based on selection information, the selector 87 can select, from the plurality of neural networks 85a, 85b, and 85c, the neural network to be used to generate the control signal. The selected neural network can function as a compensator to generate a manipulated variable based on the input information (control deviation). The selection information may be generated in the temperature control unit 26 or provided from another apparatus (for example, the control unit 24). The selection information can be generated so that the neural network to be used is selected from the plurality of neural networks 85a, 85b, and 85c in accordance with the control pattern selected from the plurality of control patterns. The plurality of control patterns can be control patterns that can be distinguished from each other. The control pattern can be, for example, a target value string (time-series data of target temperatures).

The temperature control unit 26 can include the subtractor 86 that calculates a difference (that is, a control deviation) between the target value (target temperature) and the output (measured temperature) of the temperature sensor 28. The selector 87 can include the demultiplexer 87a and the multiplexer 87b. The demultiplexer 87a can supply the control deviation to the neural network designated by the selection information among the plurality of neural networks 85a, 85b, and 85c. The multiplexer 87b can output a signal generated by the neural network designated by the selection information among the plurality of neural networks 85a, 85b, and 85c. Note that FIG. 10 exemplifies the three neural networks 85a, 85b, and 85c but the number of neural networks is arbitrary. The number of layers and the number of neurons of each of the plurality of neural networks 85a, 85b, and 85c are arbitrary. The parameter values of the plurality of neural networks 85a, 85b, and 85c can be decided by reinforcement learning.

Each of the plurality of neural networks 85a, 85b, and 85c can be selected by the selector 87 to be used in execution of one corresponding control pattern among the control patterns for controlling the control target. Alternatively, each of the plurality of neural networks 85a, 85b, and 85c can be selected by the selector 87 to be used for at least part of at least one of the plurality of control patterns for controlling the control target.

Figure 11:
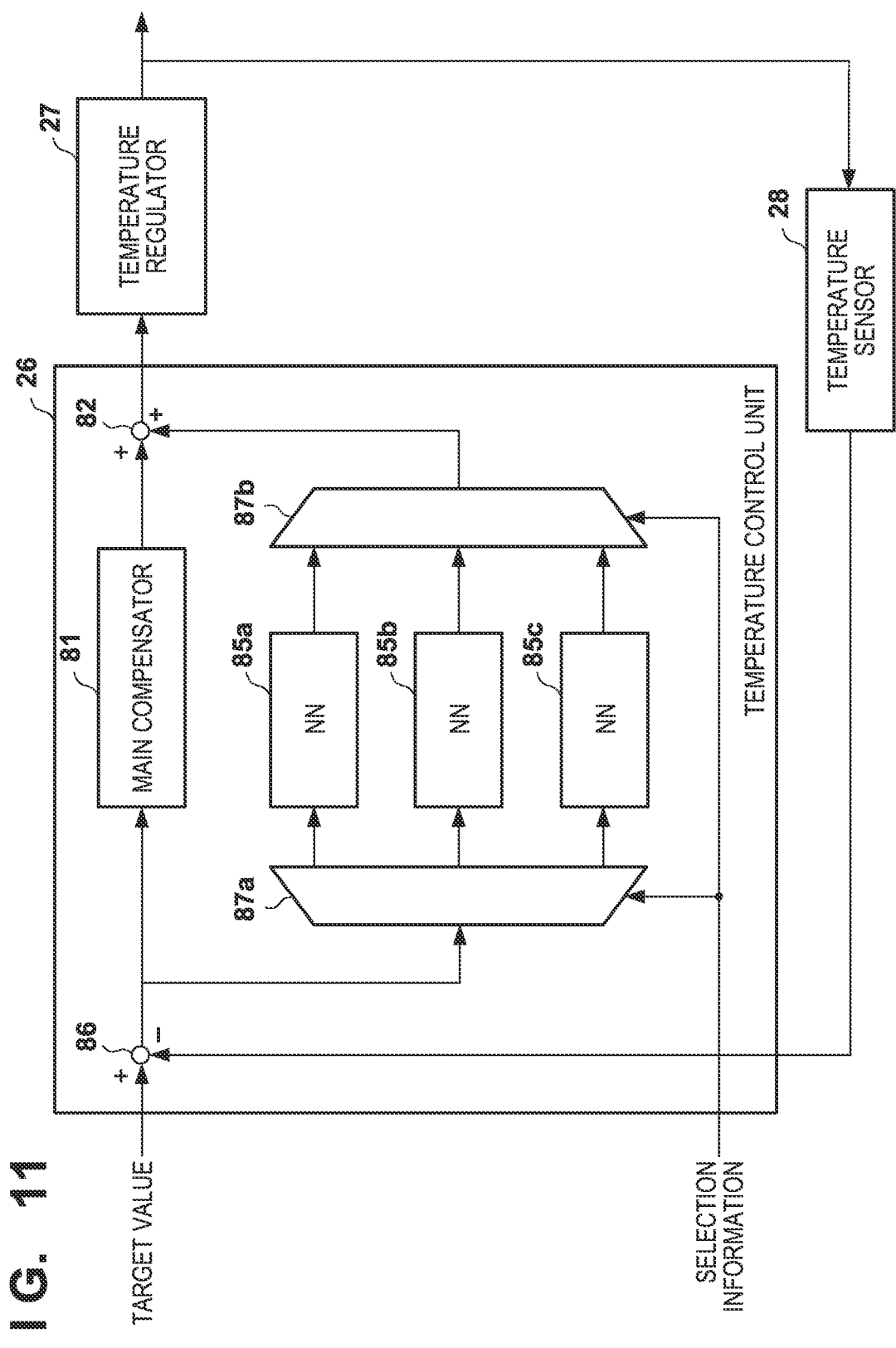
FIG. 11 is a block diagram showing another arrangement example of the temperature controller.

FIG. 11 is a block diagram showing another arrangement example of the temperature controller 25 exemplified in FIG. 9. The arrangement example shown in FIG. 11 includes an arrangement obtained by adding the main compensator 81 and the adder 82 to the arrangement example shown in FIG. 10. The main compensator 81 can be, for example, a compensator (for example, a PID compensator) including a P element (proportional element), an I element (integral element), and a D element (derivative element) but is not limited to this. The subtractor 86 calculates a difference between the target value (for example, the target temperature) and the output temperature (measured temperature) of the temperature sensor 28, and supplies the difference to the neural network selected by the selector 87 while supplying the difference to the main compensator 81. The adder 82 can add the first manipulated variable generated by the main compensator 81 and the second manipulated variable generated by the neural network selected by the selector 87, thereby generating a control signal. This control signal can be supplied to the temperature regulator 27.

The temperature in the chamber of the scanning exposure apparatus 500 can change by, for example, heat generated by the original stage mechanism 12 and the substrate stage mechanism 15. If the exposure sequence of the substrate starts, a current flows into the actuators of the original stage mechanism 12 and the substrate stage mechanism 15, thereby causing the original stage mechanism 12 and the substrate stage mechanism 15 to generate heat. Immediately after the start of the exposure sequence, a temperature change in the space in the chamber is large, and then becomes gentle as the exposure sequence of the substrate continues. That is, the temperature change and the number of processed substrates have a correlation.

Therefore, the selection information may be changed in accordance with the number of processed substrates, thereby switching the neural network to be used for temperature control among the plurality of neural networks 85a, 85b, and 85c. For example, the neural network 30a can control the temperature in the processing time from the first substrate to the 10th substrate, during which the temperature greatly changes. After that, the neural network 30a can control the temperature in the processing time from the 11th substrate to the 50th substrate, and the neural network 30c can control the temperature in the processing time for the 51st substrate and subsequent substrates.

Alternatively, the driving amounts of the original stage mechanism 12 and the substrate stage mechanism 15 can change depending on the exposure recipe (for example, a shot region size), and thus the heating value can change. The selection information may be changed in accordance with the exposure recipe, thereby switching the neural network to be used for temperature control among the plurality of neural networks 85a, 85b, and 85c.

The example in which the manufacturing system MS is applied to the scanning exposure apparatus 500 has been explained above. However, the manufacturing system MS may be applied to an exposure apparatus (for example, a stepper) of another type or a lithography apparatus of another type such as an imprint apparatus. In this case, the lithography apparatus is an apparatus for forming a pattern on a substrate, and the concept includes an exposure apparatus, an imprint apparatus, and an electron beam drawing apparatus.

An article manufacturing method of manufacturing an article (for example, a semiconductor IC element, a liquid crystal display element, or a MEMS) using the above-described lithography apparatus will be described below. The article manufacturing method can be a method that includes a transfer step of transferring a pattern of an original to a substrate using the lithography apparatus, and a processing step of processing the substrate having undergone the transfer step, thereby obtaining an article from the substrate having undergone the processing step.

If the lithography apparatus is an exposure apparatus, the article manufacturing method can include a step of exposing a substrate (a substrate, a glass substrate, or the like) coated with a photosensitive agent, a step of developing the substrate (photosensitive agent), and a step of processing the developed substrate in other known steps. The other known steps include etching, resist removal, dicing, bonding, and packaging. According to this article manufacturing method, a higher-quality article than a conventional one can be manufactured. If the lithography apparatus is an imprint apparatus, the article manufacturing method can include a step of forming a pattern made of a cured product of an imprint material by molding the imprint material on a substrate using a mold, and a step of processing the substrate using the pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A control apparatus for generating a control signal for controlling a control target, which is included in a lithography apparatus for performing processing of transferring a pattern of an original to a substrate, the control apparatus comprising:
   a selector configured to select, from a plurality of neural networks, one neural network to be used to generate the control signal, for each one of a plurality of sequences,
   wherein the selector is configured to select a first neural network from the plurality of neural networks for first sequence, and select a second neural network from the plurality of neural networks for an exposure sequence of exposing the substrate such that the pattern of the original is transferred to the substrate, the second neural network being different from the first neural network, and
   wherein the first sequence is one of a measurement sequence for alignment of the substrate and the original, a load sequence of conveying the substrate to a substrate stage, or an unload sequence of conveying the substrate on the substrate stage to a location different from the substrate stage.

2. The control apparatus according to claim 1, wherein the second neural network is selected by the selector to be used in execution of at least part of an exposure control pattern.

3. The control apparatus according to claim 1, wherein the selector selects, based on information provided from a higher level apparatus, the one neural network to be used.

4. The control apparatus according to claim 1, further comprising:
   a subtractor configured to calculate a difference between a target value and a state signal indicating a state of the control target;
   a compensator configured to calculate a manipulated variable based on the difference; and
   an adder,
   wherein the difference is supplied to the one neural network to be used, and the adder adds the manipulated variable and an output from the one neural network to be used, thereby generating the control signal.

5. The control apparatus according to claim 1, wherein the control apparatus is configured to control a position of the control target.

6. The control apparatus according to claim 1, wherein the control apparatus is configured to control a temperature of the control target.

7. A control apparatus for generating a control signal for controlling a control target, the control apparatus comprising:
   a selector configured to select, from a plurality of neural networks, a neural network to be used to generate the control signal,
   wherein an acceleration profile of the control target includes a plurality of time sections, and the plurality of time sections include a jerk section during which an acceleration increases within a positive range, a uniform acceleration section during which the acceleration is maintained at a positive constant value, a jerk section during which the acceleration decreases within the positive range, a uniform velocity section during which the acceleration is maintained at zero, a jerk section during which an absolute value of the acceleration increases within a negative range, a uniform acceleration section during which the acceleration is maintained at a negative constant value, and a jerk section during which the absolute value of the acceleration decreases within the negative range, and
   wherein in accordance with a current time section among the plurality of time sections, the selector selects, from the plurality of neural networks, the neural network to be used.

8. A lithography apparatus for performing processing of transferring a pattern of an original to a substrate, the lithography apparatus comprising:
   an operation unit configured to operate for the processing; and
   a control unit configured to generate a control signal for controlling the operation unit,
   wherein the control unit includes a selector configured to select, from a plurality of neural networks, one neural network to be used to generate the control signal, for each one of a plurality of sequences,
   wherein the selector is configured to select a first neural network from the plurality of neural networks for a first sequence, and select a second neural network from the plurality of neural networks for an exposure sequence of exposing the substrate such that the pattern of the original is transferred to the substrate, the second neural network being different from the first neural network, and
   wherein the first sequence is one of a measurement sequence for alignment of the substrate and the original, a load sequence of conveying the substrate to a substrate stage, or an unload sequence of conveying the substrate on the substrate stage to a location different from the substrate stage.

9. The lithography apparatus according to claim 8, wherein each of the plurality of neural networks is selected by the selector to be used in execution of at least part of at least one of the plurality of control patterns for controlling the operation unit.

10. The lithography apparatus according to claim 8, wherein:
the operation unit includes a scanning mechanism configured to scan the original and the substrate so as to transfer the pattern of the original to the substrate, and
the exposure sequence includes exposing the substrate while scanning the substrate and the original by the scanning mechanism.

11. The lithography apparatus according to claim 8, further comprising:
a sensor configured to detect a state of the operation unit;
a subtractor configured to calculate a difference between a target value and an output from the sensor;
a compensator configured to calculate a manipulated variable based on the difference; and
an adder,
wherein the difference is supplied to the one neural network to be used, and the adder adds the manipulated variable and an output from the one neural network to be used, thereby generating the control signal.

12. An article manufacturing method comprising:
a transfer step of transferring a pattern of an original to a substrate using a lithography apparatus defined in claim 8; and
a processing step of processing the substrate having undergone the transfer step,
wherein an article is obtained from the substrate having undergone the processing step.

13. A lithography apparatus for performing processing of transferring a pattern of an original to a substrate, the lithography apparatus comprising:
an operation unit configured to operate for the processing; and
a control unit configured to generate a control signal for controlling the operation unit,
wherein the control unit includes a selector configured to select, from a plurality of neural networks, one neural network to be used to generate the control signal, for each one of a plurality of sequences,
wherein an acceleration profile of the operation unit includes a plurality of time sections, and the plurality of time sections include a jerk section during which an acceleration increases within a positive range, a uniform acceleration section during which the acceleration is maintained at a constant value, a jerk section during which the acceleration decreases within the positive range, a uniform velocity section during which the acceleration is maintained at zero, a jerk section during which an absolute value of the acceleration increases within a negative range, a uniform acceleration section during which the acceleration is maintained at a constant value, and a jerk section during which the absolute value of the acceleration decreases within the negative range, and
wherein in accordance with a current time section among the plurality of time sections, the selector selects, from the plurality of neural networks, the one neural network to be used.

14. A control method of controlling a control target, which is included in a lithography apparatus for performing processing of transferring a pattern of an original to a substrate, the control method comprising:
selecting, from a plurality of neural networks, one neural network to be used to generate a control signal for controlling the control target, for each one of a plurality of sequences; and
controlling the control target using the control signal generated by the selected neural network,
wherein in the selecting, a first neural network is selected from the plurality of neural networks for a first sequence, and a second neural network is selected from the plurality of neural networks for an exposure sequence of exposing the substrate such that the pattern of the original is transferred to the substrate, the second neural network being different from the first neural network, and
wherein the first sequence is one of a measurement sequence for alignment of the substrate and the original, a load sequence of conveying the substrate to a substrate stage, or an unload sequence of conveying the substrate on the substrate stage to a location different from the substrate stage.

15. A control method of controlling a control target, which is included in a lithography apparatus for performing processing of transferring a pattern of an original to a substrate, the control method comprising:
selecting, from a plurality of neural networks, a neural network to be used to generate a control signal for controlling the control target; and
controlling the control target using the control signal generated by the selected neural network,
wherein an acceleration profile of the control target includes a plurality of time sections, and the plurality of time sections include a jerk section during which an acceleration increases within a positive range, a uniform acceleration section during which the acceleration is maintained at a positive constant value, a jerk section during which the acceleration decreases within the positive range, a uniform velocity section during which the acceleration is maintained at zero, a jerk section during which an absolute value of the acceleration increases within a negative range, a uniform acceleration section during which the acceleration is maintained at a negative constant value, and a jerk section during which the absolute value of the acceleration decreases within the negative range, and
wherein in the selecting, the neural network to be used is selected from the plurality of neural networks in accordance with a current time section among the plurality of time sections.

* * * * *